United States Patent
Montoya et al.

(10) Patent No.: US 9,029,741 B2
(45) Date of Patent: May 12, 2015

(54) SURFACE MOUNT MULTI-LAYER ELECTRICAL CIRCUIT PROTECTION DEVICE WITH ACTIVE ELEMENT BETWEEN PPTC LAYERS

(75) Inventors: Wayne Montoya, Redwood City, CA (US); Luis A. Navarro, San Carlos, CA (US); Cecilia A. Walsh, Los Altos, CA (US); Adrian P. Mikolajczak, Los Altos, CA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 13/477,538

(22) Filed: May 22, 2012

(65) Prior Publication Data

US 2012/0227229 A1    Sep. 13, 2012

Related U.S. Application Data

(62) Division of application No. 11/392,974, filed on Mar. 27, 2006, now Pat. No. 8,183,504.

(60) Provisional application No. 60/665,769, filed on Mar. 28, 2005.

(51) Int. Cl.
*H05B 1/02* (2006.01)
*H01C 7/18* (2006.01)
(Continued)

(52) U.S. Cl.
CPC . *H01C 7/18* (2013.01); *Y10T 29/41* (2015.01); *Y10T 29/49085* (2015.01);
(Continued)

(58) Field of Classification Search
CPC ......... H02H 3/10; H02H 9/042; H01C 7/021; H05B 3/10; H05B 3/12; H05B 1/02
USPC ......... 219/494, 501, 504, 505, 531, 511, 508; 339/22 R, 22 SC
See application file for complete search history.

(56) References Cited

U.S. PATENT DOCUMENTS

| 3,708,720 A | 1/1973 | Whitney et al. |
| 3,976,854 A | 8/1976 | Ishikawa et al. |

(Continued)

FOREIGN PATENT DOCUMENTS

| CN | 1160274 A | 9/1997 |
| CN | 11602744 A | 9/1997 |

(Continued)

OTHER PUBLICATIONS

Search Report for European Application No. EP 06 11 1942, mailed Jul. 27, 2006.

(Continued)

*Primary Examiner* — Mark Paschall

(57) ABSTRACT

A surface-mountable electrical circuit protection device includes layers defining a first PPTC resistive element, a second PPTC resistive element, and at least one heat-generating electrical component such as a planar zener diode chip positioned between, and in thermal contact with, the first and second PPTC elements, such that an electrical current above a threshold level passing through the component causes the component to heat, the heat being transferred to the PPTC resistive elements and tripping at least one, and preferably both of the first or second PPTC elements to a high resistance state. A series of edge-formed terminal electrodes enable surface-mount connection of the first and second PPTC elements and the electrical component to an electrical circuit substrate, such as a printed circuit board. A method for making the device is also disclosed.

17 Claims, 6 Drawing Sheets

(51) Int. Cl.
  *H01C 1/148* (2006.01)
  *H01C 7/02* (2006.01)
  *H02H 3/10* (2006.01)
  *H02H 9/02* (2006.01)
  *H02H 9/04* (2006.01)

(52) U.S. Cl.
  CPC .............. *H01C 1/148* (2013.01); *H01C 7/021* (2013.01); *H02H 3/10* (2013.01); *H02H 9/026* (2013.01); *H02H 9/042* (2013.01)

(56) References Cited

U.S. PATENT DOCUMENTS

| | | |
|---|---|---|
| 4,237,441 A | 12/1980 | Van Konynenburg et al. |
| 4,459,632 A | 7/1984 | Nijman et al. |
| 4,545,926 A | 10/1985 | Fouts et al. |
| 4,724,417 A | 2/1988 | Au et al. |
| 4,774,024 A | 9/1988 | Deep et al. |
| 4,780,598 A | 10/1988 | Fahey et al. |
| 4,935,156 A | 6/1990 | van Konynenburg et al. |
| 5,049,850 A | 9/1991 | Evans et al. |
| 5,250,228 A | 10/1993 | Baigrie et al. |
| 5,378,407 A | 1/1995 | Chandler et al. |
| 5,451,919 A | 9/1995 | Chu et al. |
| 5,488,348 A | 1/1996 | Asida et al. |
| 5,747,147 A | 5/1998 | Wartenberg et al. |
| 5,955,960 A | 9/1999 | Monnier |
| 5,994,167 A | 11/1999 | Tai et al. |
| 6,020,808 A | 2/2000 | Hogge |
| 6,130,597 A | 10/2000 | Toth et al. |
| 6,172,591 B1 | 1/2001 | Barrett |
| 6,236,302 B1 | 5/2001 | Barrett et al. |
| 6,300,859 B1 | 10/2001 | Myong et al. |
| 6,392,528 B1 | 5/2002 | Myong et al. |
| 6,489,879 B1 | 12/2002 | Singh et al. |
| 6,510,032 B1 | 1/2003 | Whitney |
| 6,518,731 B2 | 2/2003 | Thomas et al. |
| 6,628,498 B2 | 9/2003 | Whitney et al. |
| 6,640,420 B1 | 11/2003 | Hetherton et al. |
| 6,700,766 B2 | 3/2004 | Sato |
| 6,854,176 B2 | 2/2005 | Hetherton et al. |
| 7,180,719 B2 | 2/2007 | Whitney |
| 2002/0125982 A1 | 9/2002 | Swensen et al. |
| 2002/0162214 A1 | 11/2002 | Hetherton et al. |
| 2004/0109275 A1 | 6/2004 | Whitney |
| 2004/0257046 A1 | 12/2004 | Morimoto et al. |

FOREIGN PATENT DOCUMENTS

| | | |
|---|---|---|
| EP | 0217985 B1 | 11/1989 |
| EP | 1435682 A | 7/2004 |
| JP | 57-116537 A | 7/1982 |
| JP | 62-152407 U | 9/1987 |
| JP | 10-144506 A | 5/1998 |
| JP | 2001-052903 A | 2/2001 |
| JP | 2001-520858 A | 10/2001 |
| JP | 2002-511646 A | 4/2002 |
| JP | 2002-165358 A | 6/2002 |
| JP | 2002-540756 A | 11/2002 |
| WO | WO 99/39400 A | 8/1999 |
| WO | WO-03/050827 A1 | 6/2003 |
| WO | WO-2005/004173 A1 | 1/2005 |

OTHER PUBLICATIONS

Search Report for Taiwan Patent Application No. 95110474, dated May 22, 2012.

Search Report for Taiwanese Patent Application No. 95110474, date May 22, 2012 X.

SURFACE MOUNT MULTI-LAYER ELECTRICAL CIRCUIT PROTECTION DEVICE WITH ACTIVE ELEMENT BETWEEN PPTC LAYERS

CROSS-REFERENCE TO RELATED APPLICATIONS

This application is a divisional application of, commonly assigned U.S. application Ser. No. 11/392,974, filed Mar. 27, 2006, now U.S. Pat. No. 8,183,504, issued May 22, 2013, which claims priority from Provisional Application Ser. No. 60/665,769, filed Mar. 28, 2005. The disclosure of each of these applications is incorporated herein by reference.

BACKGROUND OF THE INVENTION

1. Field of the Invention

The present invention relates to polymeric positive temperature coefficient (PPTC) resistance electrical circuit protection devices adapted to surface mount technology. More particularly, the present invention relates to a miniature surface mount integrated component having a monolithic multi-layer package combining at least one PPTC element and at least one heat-generating semiconductor element in a manner providing improved heat transfer characteristics, the component being formed using printed circuit board construction techniques.

2. Introduction to the Invention

PTC devices are well known. Particularly useful devices contain PTC elements composed of a PTC conductive polymer, i.e. a composition comprising an organic polymer and, dispersed or otherwise distributed therein, a particulate conductive filler, e.g. carbon black, or a metal or a conductive metal compound. Such devices are referred to herein as polymer PTC, or PPTC resistors or resistive devices. Other PTC materials are also known, e.g. doped ceramics, but are not as generally useful as PTC conductive polymer, in particular because they have higher non-operating, quiescent resistivities.

As used herein, the term "PTC" is used to mean a composition of matter which has an $R_{14}$ value of at least 2.5 and/or an $R_{100}$ value of at least 10, and it is preferred that the composition should have an $R_{30}$ value of at least 6, where $R_{14}$ is the ratio of the resistivities at the end and the beginning of a 14° C. range, $R_{100}$ is the ratio of the resistivities at the end and the beginning of a 100° C. range, and $R_{30}$ is the ratio of the resistivities at the end and the beginning of a 30° C. range. Generally the compositions used in devices of the present invention show increases in resistivity that are much greater than those minimum values.

PTC resistive devices can be used in a number of different ways, and are particularly useful in circuit protection applications, in which they function as remotely resettable fuses to protect electrical components from excessive currents and/or temperatures. Components which can be protected in this way include motors, batteries, battery chargers, loudspeakers, wiring harnesses in automobiles, telecommunications equipment and circuits, and other electrical and electronic components, circuits and devices. The use of PPTC resistive elements, components and devices in this way has grown rapidly over recent years, and continues to increase.

Suitable conductive polymer compositions and elements, and methods for producing the same, are disclosed for example in U.S. Pat. No. 4,237,441 (van Konynenburg et al.), U.S. Pat. No. 4,545,926 (Fouts et al.), U.S. Pat. No. 4,724,417 (Au et al.), U.S. Pat. No. 4,774,024 (Deep et al.), U.S. Pat. No. 4,935,156 (van Konynenburg et al.), U.S. Pat. No. 5,049,850 (Evans et al.), U.S. Pat. No. 5,250,228 (Baigrie et al.), U.S. Pat. No. 5,378,407 (Chandler et al.), U.S. Pat. No. 5,451,919 (Chu et al.), U.S. Pat. No. 5,747,147 (Wartenberg et al.) and U.S. Pat. No. 6,130,597 (Toth et al.), the disclosures of which are incorporated herein by reference.

It is known to provide PPTC resistor devices or elements in protective electrical connection and thermal contact with electronic components such as zener diodes, metal oxide semiconductor field effect transistors (MOSFETs), and more complex integrated circuits forming voltage/current regulators, as exemplified by the teachings and disclosures set forth in commonly assigned U.S. Pat. No. 6,518,731 (Thomas et al.) (particularly FIGS. 45 to 47), the disclosure of which is incorporated herein by reference. Also, see for example U.S. Pat. No. 3,708,720 (Whitney et al.) and U.S. Pat. No. 6,700,766 (Sato). These exemplary patents do not show fully integrated surface mounted components made by using low cost printed circuit board manufacturing techniques in which the heat-generating element, such as a semiconductor chip, is connected to a printed circuit board via one or more contact pads provided by the PPTC carrier structure.

Circuit elements comprising PPTC resistive elements have been formed in accordance with printed circuit board (PCB) construction techniques. In these prior approaches, PPTC plaque(s) serves as a material layer(s) and is incorporated into a PCB construction by lamination using PCB lamination processes and materials in order to form circuitry layers for external mounting of other discrete passive or active electrical components. Examples of circuit protection devices including PPTC-PCB laminar constructions include U.S. Pat. No. 6,300,859 (Myong et al.) and U.S. Pat. No. 6,392,528 (Myong), the disclosures of which are incorporated herein by reference.

Some passive electrical components can be embedded layers in the PPTC-PCB construction. These embedded layers can be resistors, capacitors, and inductor elements. Plated vias (whether through-hole, blind, buried, isolated, etc.) enable appropriate electrical connections to be made from layer to layer.

It is known to provide a multi-layer PPTC resistive device. One reason for providing multi-layer devices is to provide increased current handling capabilities within a resistive device by providing increased surface area contact between the PPTC plaque and current-carrying electrode layers without increasing the "footprint" of the device. The device may have multiple conductive layers as an integrated construction, as suggested by U.S. Pat. No. 6,236,302 (Barrett et al.); or, the device may be formed by stacking separately formed PPTC resistive elements, as suggested by published U.S. Patent Application No. US2002/0125982 (Swensen et al.).

Multi-layer surface mount PPTC resistor fabrication methods and resultant electrical components are described in commonly assigned U.S. Pat. No. 6,640,420 (Hetherton et al.). In particular, FIGS. 16 through 19 illustrate a three-contact surface mount composite device having two electrical elements in thermal contact and electrically connected in a series arrangement. A related published US Patent Application No. US2002/0162214A1 (Hetherton et al.), now U.S. Pat. No. 6,854,176, includes a stacked PPTC surface mount device having upper face contact pads for receiving and connecting additional elements, such as one or more semiconductor devices. The disclosures of this patent and published application are incorporated herein by reference.

Further, it has been proposed by U.S. Pat. No. 6,489,879 (Singh et al.) to bond a semiconductor die forming a heating element to a PPTC lead frame using thermally conductive epoxy. However, the resultant assembly comprises and requires a structurally complex multi-contact lead carrier structure that is not formed in accordance with low cost printed circuit board manufacturing techniques. Also, once the completed device is surface-mounted to a printed circuit board, it may not be possible to inspect visually the integrity of connection of the interior contact leads of the semiconductor device to the underlying printed circuit board.

Separate from the use of PPTC plaques and laminar constructions, it has been suggested to sandwich a semiconductor diode between two printed circuit board layers in order to realize a surface-mountable diode component, as suggested by U.S. Pat. No. 5,994,167 (Tai et al.). However, the arrangement disclosed therein does not address or solve any of the thermo-electric problems solved by the present invention.

A hitherto unsolved need has remained for a miniature surface mount integrated component having a monolithic planar package combining a heating element carrier including at least one PPTC element and at least one heat-generating electrical element such as a semiconductor die in a manner providing improved heat transfer characteristics, the heating element carrier being formed by using low cost printed circuit board construction techniques.

BRIEF SUMMARY OF THE INVENTION

A general object of the present invention is to provide a surface-mountable laminar electrical circuit protection device comprising at least one PPTC resistor with improved thermal contact with a heat-generating electrical component, such as a semiconductor device, in a manner overcoming limitations and drawbacks of the prior art.

Another general object of the present invention is to provide improved thermal transfer between a PPTC resistor and a heat generating electrical component, such as a semiconductor device by use of a metal bond between oppositely facing planar major surfaces of the PPTC resistor and electrical component.

One more general object of the present invention is to provide a heating element carrier comprising at least one layer of PPTC resistor material and formed in accordance with printed circuit board manufacturing techniques, for carrying and electrically connecting a heating element such as a semiconductor die in a manner overcoming limitations and drawbacks of the prior art.

A related object of the present invention is to provide a surface-mountable laminar electrical circuit protection device which includes plural PPTC resistive elements formed in a package in a manner maximizing thermal contact with a heat-generating circuit element, such as an electrically active element comprising a planar semiconductor chip, for example a voltage clamping diode or other voltage clamping structure (e.g. a zener diode), or transistor, and the like, or an electrically passive element such as a planar resistor, varistor, capacitor, inductor or the like.

One more object of the present invention is to provide an improved method for making a surface-mountable electrical circuit protection device carrier including at least one PPTC resistor layer using printed circuit board fabrication techniques for carrying and electrically connecting a heat generating element thermally directly coupled to the PPTC resistor layer, in a manner overcoming limitations and drawbacks of the prior art.

In accordance with one aspect of the present invention, a surface-mountable electrical circuit protection device includes a generally box-shaped heat-generating element carrier comprising a central planar layer forming a first polymeric positive temperature coefficient ("PPTC") resistor having first and second major surfaces. A first electrode layer is formed at the first major surface and is in intimate electrical contact with the first major surface of the PPTC resistor. A second electrode layer is formed at the second major surface and is in intimate electrical contact therewith. The element carrier defines a space or region for receiving at least one heat-generating electrical element, such as a semiconductor chip comprising a diode, e.g. a voltage clamping diode such as a zener diode, or other voltage clamping structure, for example. At least first, second and third terminal electrode regions are formed along one or more edge walls of the device for enabling surface mounting and electrical connection of the device to an electrical circuit substrate such as a printed circuit board. The heat-generating electrical element has a first metallized contact face that is directly bonded to a metal layer path within the element carrier space comprising a part of the first electrode layer. A second metallized contact face of the heat-generating electrical element is connected to the third terminal electrode region by an electrical interconnect structure, such as a metal layer or interconnect strap, such that a current above a threshold level flowing through the heat-generating electrical element in an electrical circuit including the device generates heat that is transferred directly to the first PPTC resistor to aid (e.g. hasten) tripping to a high resistance, circuit protection state.

In accordance with a second aspect of the present invention, a surface-mountable laminar electrical circuit protection device includes:
  (a) a first PPTC resistive element having first and second major surfaces, a first electrode formed at the first surface and in intimate electrical contact therewith, and a second electrode formed at the second major surface and in intimate electrical contact therewith;
  (b) at least one heat-generating electrical component, such as a planar zener diode chip, having a major surface in direct thermal contact, e.g. through metallized contact, with one of the first and second electrodes of the first PPTC resistive element, such that an electrical current above a threshold level passing through the electrical component causes the electrical component to heat, the heat being directly and rapidly transferred to trip the first PPTC resistive element to a high resistance state, and
  (c) at least three terminal electrodes formed along major edges of the device for enabling surface-mount connection of the first PPTC resistive element and the electrical component to an electrical circuit substrate, such as a printed circuit board.

As a related aspect of the invention, the electrical component is sandwiched between the first PPTC element and a second PPTC resistive element and a predetermined pair of the at least three terminal electrodes electrically connect the first PPTC element and the second PPTC element in a parallel circuit arrangement.

As another aspect of the present invention, a method is provided for making a surface-mountable electrical circuit protection device. This method includes the following steps:
  (a) forming a substantially planar polymeric positive temperature coefficient resistive ("PPTC") layer having predetermined electrical characteristics and physical dimensions including first and second major surfaces, forming a first electrode layer at the first major surface in intimate electrical contact therewith, and forming a second electrode layer at the second major surface in intimate electrical contact therewith;
  (b) forming first, second and third terminal electrodes along at least one major edge wall of the device, the first terminal electrode being in electrical connection with the first electrode layer, the second terminal electrode being in electrical connection with the second electrode layer, and the third terminal electrode being electrically isolated from the first and second terminal electrodes;

(c) bonding a first metallized face of at least one heat-generating electrical element to a part of the first electrode layer arranged to receive the heat-generating electrical element; and, (d) connecting a second metallized face of the at least one heat-generating electrical element to the third terminal electrode with an interconnect structure.

As a further aspect of the invention, a method is provided for making a surface-mountable electrical circuit protection device. The method includes the following steps:

(a) forming a substantially planar first PPTC element having predetermined electrical characteristics and physical dimensions including first and second major surfaces, forming a first electrode at the first major surface in intimate electrical contact therewith, and forming a second electrode at the second major surface in intimate electrical contact therewith;

(b) securing a metallized major face of at least one heat-generating electrical component directly to one of the first and second electrodes with a flowable metal binder, such as a solder, and (c) forming metal interconnection structures including at least three terminal electrodes along at least one major edge of the device, the structures for connecting the first PPTC element and the heat-generating electrical component in a series arrangement, the terminal electrodes for enabling a surface-mounting connection of the first PPTC element and the electrical component to an electrical circuit substrate.

As a related aspect the method includes forming a substantially planar second PPTC element having predetermined electrical characteristics and physical dimensions including third and fourth major surfaces, forming a third electrode at the third major surface in intimate electrical contact therewith, and forming a fourth electrode at the fourth major surface in intimate electrical contact therewith; and sandwiching the heat-generating electrical component between the first and second PPTC elements of the surface-mountable electrical circuit protection device.

These and other objects, advantages, aspects and features of the present invention will be more fully understood and appreciated upon consideration of the detailed description of preferred embodiments presented in conjunction with the following drawings.

DETAILED DESCRIPTION OF THE INVENTION

Figure 1:
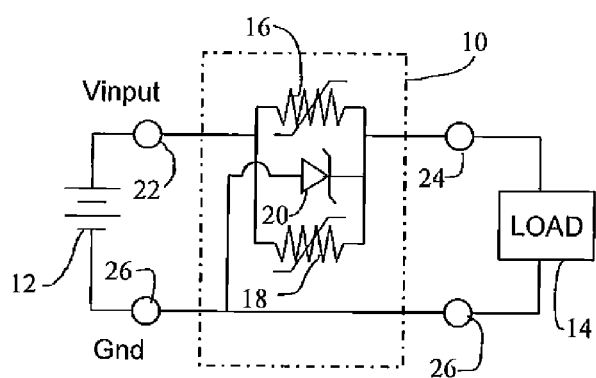
FIG. 1 is an electrical circuit schematic diagram of an exemplary surface-mountable electrical circuit protection device in accordance with a first preferred embodiment of the present invention, shown connected between a power source and a load.

As a first preferred embodiment of the present invention, FIG. 1 provides a simplified electrical circuit schematic diagram of a surface mountable multi-layer integrated electrical circuit protection device 10. The device 10 preferably includes at least three electrical terminal electrodes: a first or input terminal electrode 22, a second or output terminal electrode 24, and a third or ground return terminal electrode 26. A power source 12 such as a battery or other energy source is connected to terminal electrodes 22 and 26 so as to provide electrical energy to a load 14 connected to terminal electrodes 24 and 26. As shown in FIG. 1, the device 10 provides over-current and over-voltage protection to the load 14 by providing two parallel-connected PPTC resistor elements 16 and 18 which limit current flow from the source 12 to the load 14 to a maximum current level, and with the zener diode element 20 limiting output voltage supplied to the load 14 to a maximum voltage level. The PPTC resistor elements 16 and 18 are in intimate thermal contact with the heat generating zener diode element 20, such that heat generated in the element 20 is efficiently and rapidly transferred to the thermally coupled PPTC resistor element and aids (e.g. by hastening) its trip to a high resistance, circuit protection operational state.

Figure 2:
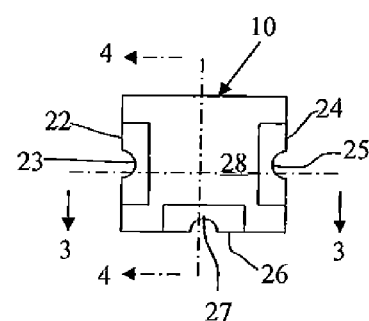
FIG. 2 is a top plan structural view of the first preferred embodiment of the surface-mountable electrical circuit protection device shown electrically in FIG. 1.
Figure 6:
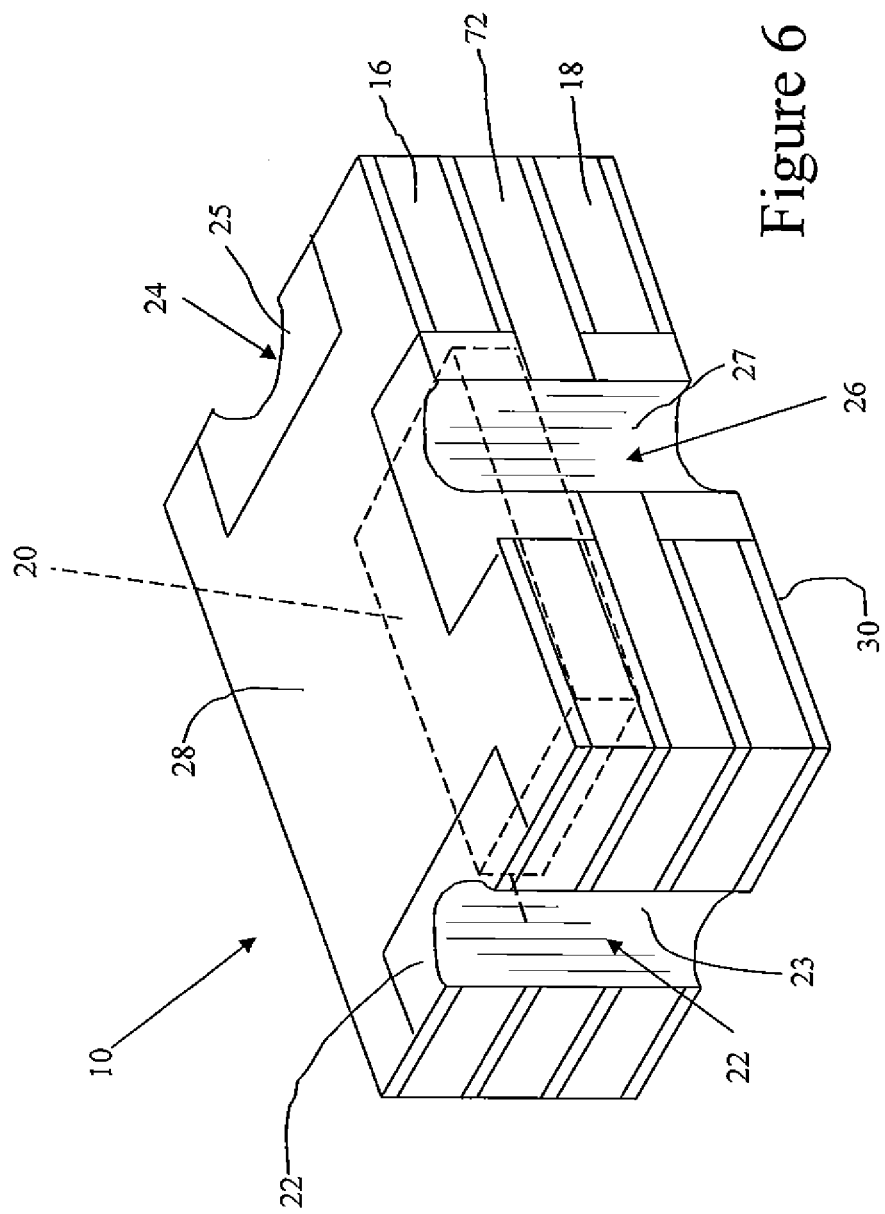
FIG. 6 is an enlarged isometric view showing the completed device of FIG. 2 in accordance with one preferred manufacturing method.

The device 10 is most preferably in the form of a monolithic construction integrally containing and carrying the heat generating element 20 as shown in the FIG. 2 plan view and in the FIG. 6 isometric view in which the three terminal electrodes 22, 24 and 26 are arranged and adapted for surface mounting directly to a printed circuit board in accordance with conventional surface mounting methods and arrangements.

The device 10, while shown to be generally rectangular in FIGS. 2-6, can follow any practical shape or geometry, whether rectangular, square, curved, elongate or other desired form. Also, while the FIG. 2 top plan depiction of the protection device 10 shows the terminal electrodes formed on separate major edge walls of the laminar construction, those skilled in the art will appreciate that terminal electrodes can be formed along every major edge wall, or along a few or a single major edge wall. If terminal electrodes are formed along a single edge wall, the device 10 may be surface-mounted to a printed circuit board substrate in a vertical or end up mounting orientation. Also, more than three terminal electrodes may be provided along an edge wall or edge walls of the device 10. Illustrative of an alternative terminal electrode arrangement, a device 200 forming another presently preferred embodiment of the present invention is shown in FIGS. 7 through 12. Therein, the surface mount device 200 has one terminal electrode 202 along a first edge wall 208 and two terminal electrodes 204 and 206 spaced apart along a second edge wall 210 opposite the first edge wall 208.

Returning to the first embodiment, as shown electrically in FIG. 1, and structurally in FIGS. 2 to 6, the exemplary device 10 includes a heat-generating electrical element, such as a planar zener diode chip 20 sandwiched between a pair of PPTC resistor layers 16 and 18. The PPTC resistors 16 and 18 are electrically connected in parallel, and are physically arranged such that heat generated by the centrally located element 20 is transferred to and dissipated through the layers 16 and 18. In particular, a lower major contact face of the zener diode chip 20 is suitably plated and bonded via a metallic agent layer 46, such as a solder or metal-filled adhesive, to a foil layer 48 covering the top major surface of PPTC resistor 18 to enhance thermal transfer from the zener diode chip 20 to the underlying PPTC resistor 18. While a zener diode semiconductor chip 20 is shown by way of example in FIGS. 3 to 6, those skilled in the art will appreciate that the heat-generating electrical element may comprise a wide range of substantially planar active electrical devices and elements, such as active semiconductor dies forming an integrated circuit (IC), one or more bipolar junction transistors and/or field effect transistors, triacs, thyristors, silicon controlled rectifiers, or combinations thereof, and passive electrical devices such as a planar film resistor, a metal oxide varistor, a thermistor, a planar chip capacitor, or a substantially planar inductor with or without a magnetic core, or combinations thereof, for example.

As is known each PPTC resistor layer 16, 18 normally presents a very low resistance path in an electrical circuit, with resistance being a function of the conductivity of the particular PPTC material and the area of surface contact between electrical conductors and opposite major surfaces of each PPTC resistor layer. If heating, either in the resistors 16, 18 and/or in the active device 20, reaches a particular level, the higher temperature level causes the PPTC resistor layers 16 and 18 to "trip" in a manner analogous to a fuse or circuit breaker, and thereupon present a very high electrical resistance in the path between terminal electrodes 22 and 24, thereby isolating the load 14 from the power source 12, and protecting both source and load from damage otherwise resulting from an over-voltage or over-current condition, for example. When the resistor layers 16 and 18 cool to a reset temperature they thereupon can automatically "reset" and again present a very low resistance path between terminal electrodes 22 and 24.

Figure 3:
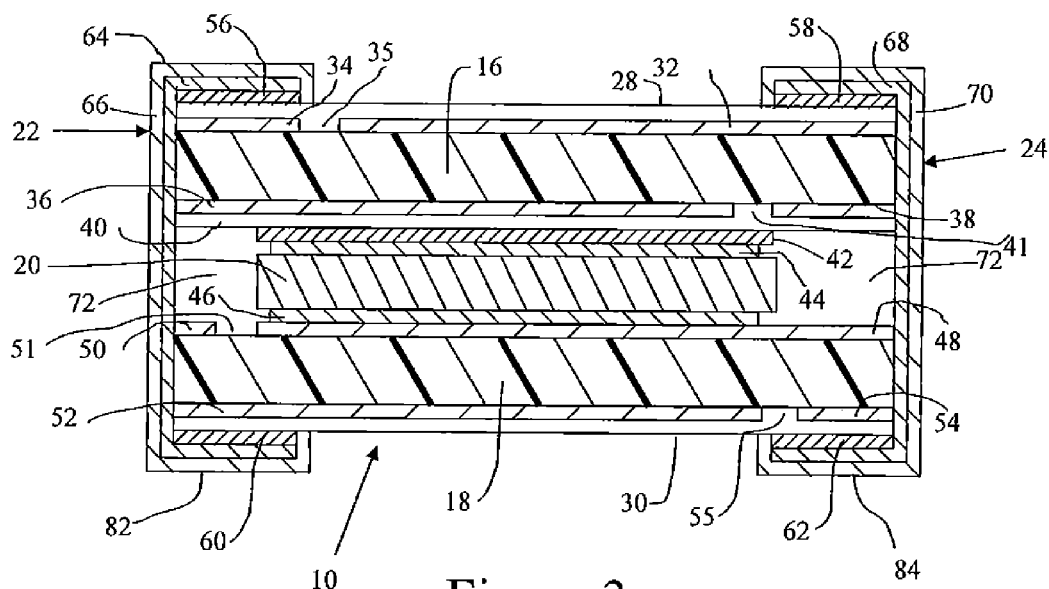
FIG. 3 is an enlarged view in elevation and cross-section of the FIG. 2 device along line 3-3 in FIG. 2.
Figure 4:
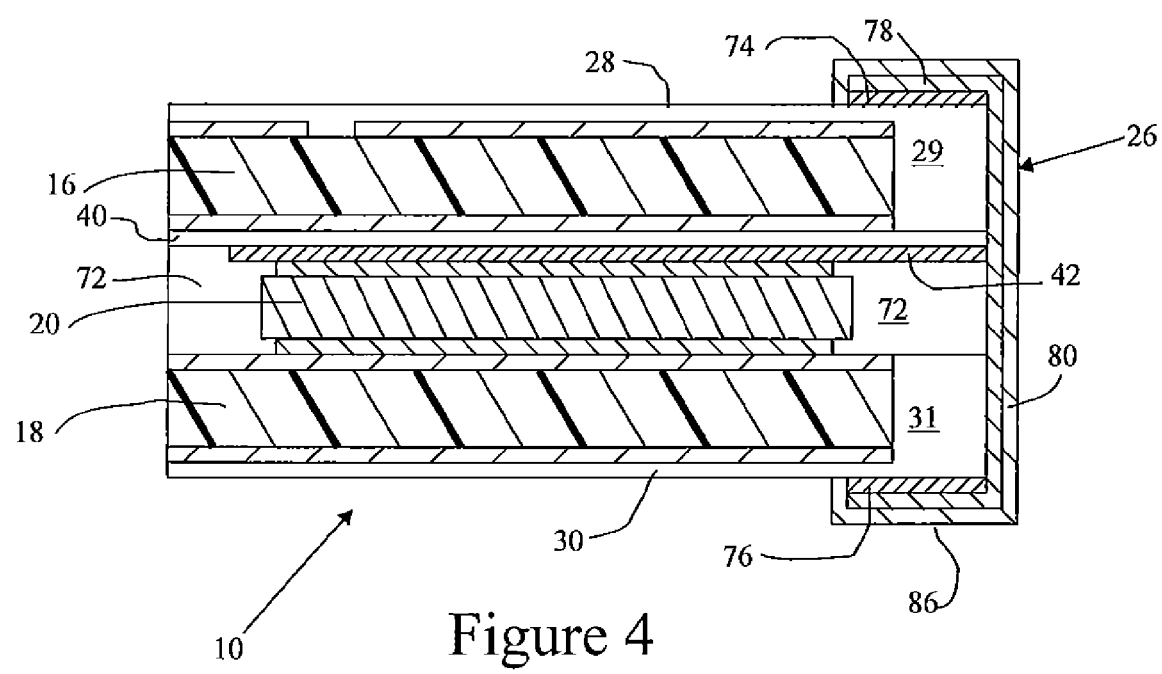
FIG. 4 is an enlarged view in elevation and cross-section of the FIG. 2 device along line 4-4 in FIG. 2.

As shown in FIGS. 3 to 6, the multi-layer circuit protection device 10 includes a number of alternating layers and patterned regions of electrically conductive and electrically insulative (dielectric) materials. An outer dielectric layer 28, formed of material such as fiber reinforced resin (FR4, shown as a top layer in the FIG. 2 plan view) is formed over the first PPTC resistor layer 16 and foil layers 32,34, and an outer dielectric layer 30 (a bottom dielectric layer as shown in FIGS. 3 and 4) is formed over the second PPTC resistor layer 18 and foil layers 52,54.

A first metal foil layer 106 (FIG. 5), e.g. copper or copper/nickel, is formed at an outer major surface of the first PPTC resistor 16 and is patterned into a major segment 32 having intimate electrical contact with the outer major surface of resistor 16 and with the terminal electrode 24, and a minor segment 34 also in contact with a small area of the outer major surface of resistor 16 and in electrical contact with the terminal electrode 22. A channel 35 is formed between, and electrically isolates, the major segment 32 and the minor segment 34.

A second metal foil layer 108, e.g. copper or copper/nickel, is formed at an inner major surface of the first PPTC resistor 16 and is patterned into a major segment 36 having intimate electrical contact with the inner major surface of resistor 16 and with the terminal electrode 22, and a minor segment 38 also in contact with a small area of the inner major surface of resistor 16 and in electrical contact with the terminal electrode 24. A layer 40 of dielectric material is formed to cover the segments 36 and 38. A channel 41 is formed between, and electrically isolates, the major segment 36 and the minor segment 38, and the channel 41 is filled with dielectric material forming the insulative layer 40.

A third metal foil layer 42, e.g. copper, is formed at a connection surface of the active device, such as the cathode electrode of the zener diode 20, and electrically connects to the third ground-return terminal electrode 26 as shown in FIG. 4. The third foil layer 42 is preferably formed on the dielectric layer 40. A photoresist layer 110 is then formed on the third copper foil layer and selectively removed to define an area sized and adapted to receive the semiconductor chip 20 and connect to the cathode electrode of the planar diode chip 20 with a solder compound 44 (e.g. a eutectic solder compound such as tin/lead or tin/silver/copper) when two laminar structures 102 and 104, respectively including the PPTC resistor layers 16 and 18, are brought together to form the laminar protection device 10 in manufacturing. A photoresist layer 116 is formed and patterned on a fourth metal (e.g. copper) layer segment 48 of the lower laminar structure 104 and also defines an opening sized to receive the semiconductor chip 20.

A second layer of solder 46 which may be the same or different from the first layer 44 is provided at the anode electrode surface of the planar diode chip 20 and enables a direct metallic connection to a patterned major segment 48 of upper foil layer 108 of PPTC resistor 18 and to terminal electrode 24 as shown in FIG. 3 for example, after the PPTC resistor layers 16 and 18 have been bonded together in manufacturing. As one aspect of the present invention the direct metallic connection between the zener diode chip 20 and the PPTC resistor 18 provides improved thermal transfer characteristics between the diode die and the PPTC resistive material. While FIGS. 1, 3 and 4 illustrate the cathode electrode of the diode chip 20 to be connected in common with terminal electrode 24, and the anode electrode of the diode chip 20 to be connected to the ground terminal electrode 26, those skilled in the art will readily appreciate that the anode and cathode connections can be reversed by reversing (turning over) the diode chip 20 within the device 10.

A fourth metal (e.g. copper or copper/nickel) foil layer 112 is formed at an inner major surface of the second PPTC resistor 18 and is patterned into the major segment 48 having intimate electrical contact with the inner major surface of PPTC resistor 18 and with the terminal electrode 24. Upon assembly of device 10 the major segment 48 also becomes electrically connected to the anode electrode surface of the planar diode chip 20 by melt bonding of the solder layer 46, as already noted above. The fourth patterned metal foil layer also includes a minor segment 50 in contact with a small area of the inner major surface of PPTC resistor 18 and in electrical contact with the terminal electrode 22. A channel 51 is formed between, and electrically isolates, the major segment 48 and the minor segment 50, and during manufacturing of the device 10 the channel 41 becomes filled with a cured plastic dielectric material 72 filling in a gap or space otherwise remaining between exposed outer walls of the planar chip 20 and outer side walls of the device 10. The rectangular cured plastic frame 72 essentially forms a box shaped container or recess for holding the chip 20 and for protecting and sealing the chip 20 against unwanted contact with ambient environmental conditions.

A fifth patterned metal (e.g. copper or copper/nickel) foil layer is formed at an outer major surface of the second PPTC resistor 18 and is patterned into a major segment 52 having intimate electrical contact with the outer major surface of PPTC resistor 18 and with the terminal electrode 22, and a minor segment 54 also in contact with a small area of the outer major surface of resistor 18 and in electrical contact with the terminal electrode 24. The lower outer dielectric layer 30 covers the segments 52 and 54. A channel 55 is formed between, and electrically isolates, the major segment 52 and the minor segment 54, and the channel 55 is filled with dielectric material forming the insulative layer 30.

The channels 35, 41, 51 and 55 may be formed by using standard printed circuit patterning techniques, such as photolithography and wet etching, or machining, milling, stamping, or the like. After each channel is formed, it most preferably is filled with an electrically insulative dielectric material as already explained above.

Figure 5:
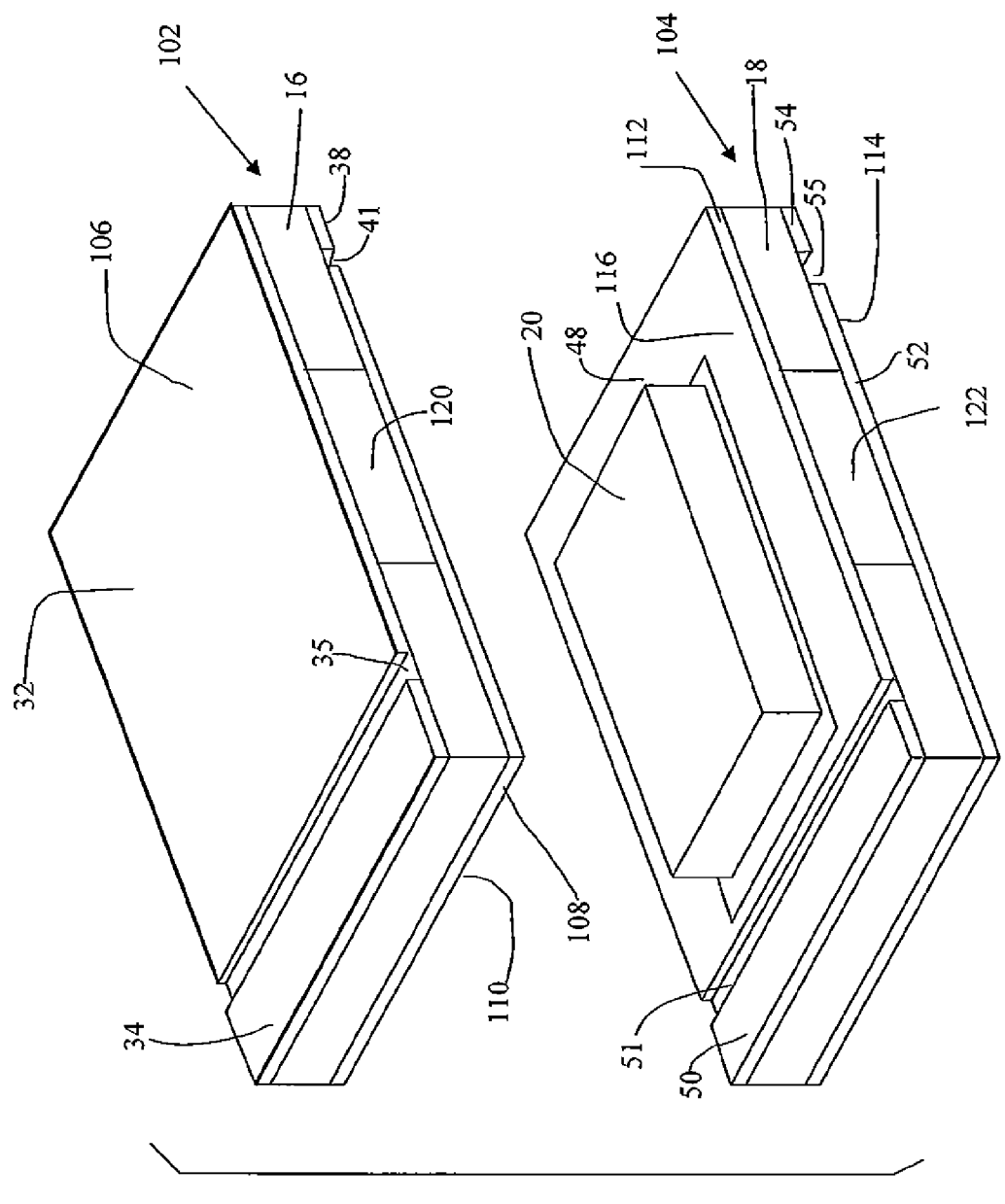
FIG. 5 is an enlarged, exploded isometric view showing laminar elements forming the FIG. 2 device illustrative of one preferred manufacturing method.

Turning to FIG. 5, the two PPTC structures 102 and 104 include plugged hole regions 120 and 122 filled with dielectric material. The isolation regions 120 and 122 are provided in the structures 102 and 104 to isolate the electrical via and terminal electrode 26 from the PPTC resistors 22 and 24. Plugged hole regions are needed at every terminal electrode location not directly connected to adjacent structure of the PPTC resistors 16 and 18. After the heat generating element, such as semiconductor diode chip 20, is positioned, the two PPTC laminar structures 102 and 104 are brought together, heat is applied, and the eutectic solder in layers 44 and 46 is permitted to remelt and bond plated major contact faces of the chip 20 to the facing patterned copper surface segments 36 and 48 of the structures 102 and 104. Then, encapsulant material 72, such as a curable plastic resin, is emplaced in the peripheral gap between the structures 102 and 104 and cured to solid phase, further to adhere the two structures 102 and 104 together, to seal the chip 20 from exposure to the ambient, and to form a dielectric peripheral frame.

After the device 10 is assembled into a laminar construction, and the chip 20 is sealed against exposure to ambient environmental conditions by the encapsulant material 72, the edge regions forming terminal electrodes 22, 24 and 26 are drilled to form semi-cylindrical vias 23, 25, and 27 (shown in FIGS. 2 and 6). These vias 23, 25, and 27 are then plated with a suitable conductor material, such as copper, tin or a copper alloy.

A sixth metal foil layer is formed at the outer surface of the top dielectric layer 28, and is patterned or etched to define terminal foil segments 56, 58 and 74. Segment 56 becomes part of terminal electrode 22; segment 58 is part of terminal electrode 24; and, segment 74 is part of terminal electrode 26. Similarly, a seventh foil layer is formed at the outer surface of bottom dielectric layer 30, and is patterned and etched to define terminal foil segments 60, 62, and 76. Segment 60 is part of terminal electrode 22; segment 62 is part of terminal electrode 24; and, segment 76 is part of terminal electrode 26.

Then, several plating layers are formed and patterned. Inner copper electrode layers 64, 68, and 78 are plated up at terminal locations 22, 24 and 26, respectively. Then outer tin layers 66, 70, and 80 are plated over the copper layers 64, 68 and 78, respectively. The plated layers 64 and 66 of electrode 22 extend over the foil segments 56 and 60; the plated layers 68 and 70 of electrode 24 extend over the foil segments 58 and 62; and, the plated layers 78 and 80 of electrode 26 extend over the foil segments 74 and 76 (as shown in FIG. 4).

Lower outer surfaces 82, 84 and 86 of terminal electrodes 22, 24 and 26, respectively, enable the device 10 to be surface mounted in conventional fashion, e.g., by flow or wave soldering, to an appropriately dimensioned and patterned printed circuit board forming a circuit arrangement including over voltage protection provided by device 10, such as the circuit shown in FIG. 1, for example.

A second preferred embodiment of the present invention is shown in FIGS. 7 through 12. First considering FIG. 10, a surface mountable multi-layer electrical circuit protection device 200 includes a PPTC resistor chip carrier 201 and a generally rectangular heat generating element such as a semiconductor die 218. The heat generating element 218 is bonded to the carrier 201 in a well 245 which may be generally cylindrically shaped such that one terminal of the chip 218 is connected to terminal electrode 202, for example. A strap interconnect 222 connects the other terminal of the chip 218 to a metallized extension 207 of the third terminal electrode 206 of the chip carrier 201 for example. In this example of the present invention, the completed device provides one PPTC resistor 216 and a heat generating element 218 in a circuit arrangement similar to the arrangement shown in FIG. 1 (without the second parallel-connected PPTC resistor 18).

The chip carrier 201 is preferably formed as a generally rectangular shaped box structure comprising a central planar sheet of PPTC material forming PPTC resistor 216. As shown in the top plan views of FIGS. 7 and 10, the left edge wall 208 of the chip carrier 201 includes the first terminal electrode 202, and the right edge wall 210 of the chip carrier 201 includes the second terminal electrode 204 and the third terminal electrode 206 in a spaced-apart arrangement. The carrier well 245, shown as generally cylindrical, is defined in a top face of the chip carrier 201 and is dimensioned to receive and connect a heat generating electrical element, such as a semiconductor die forming a zener diode 218, for example.

Figure 11:
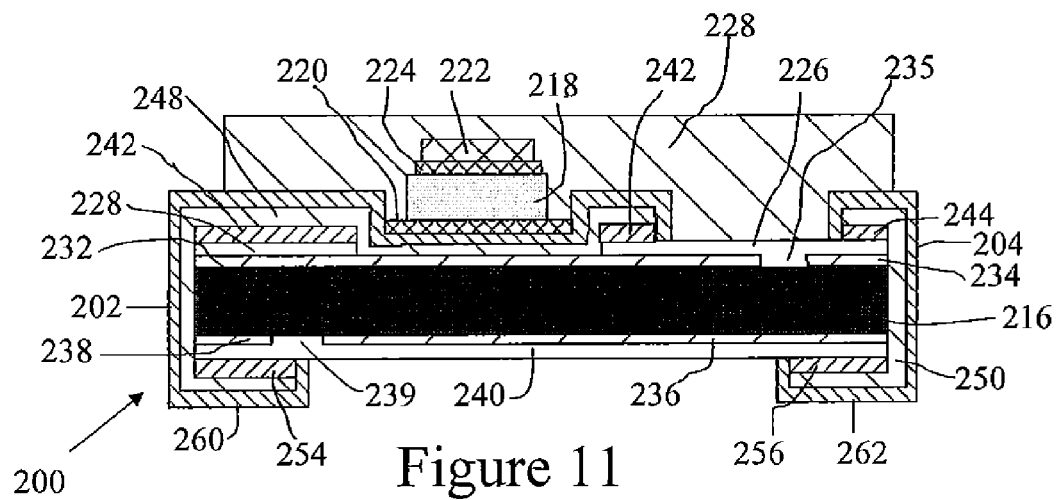
FIG. 11 is an enlarged view in elevation and cross-section along the dashed section line 11-11 in FIG. 10.
Figure 12:
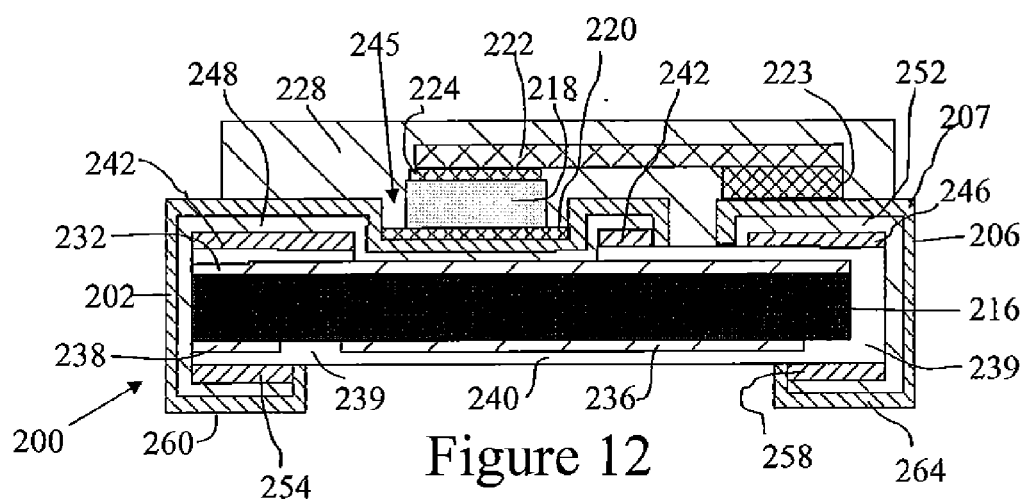
FIG. 12 is an enlarged view in elevation and cross-section along the dashed section line 12-12 in FIG. 10.

As shown in FIGS. 11 and 12, a bottom contact face of the die 218 is suitably plated or metallized so as to be directly bonded to an underlying recessed metal layer 261 (which extends from layer 260) via remelting of a suitable solder layer 220, which may be tin or tin/lead or tin/silver/copper, for example. The layer 260 is formed upon another metal layer 248 which in turn is formed upon a metal foil layer 232 directly attached to the PPTC material layer 216. Thus, in accordance with one aspect of the present invention, the heat generating element, e.g. semiconductor die 218, has a direct metal connection to the PPTC layer 216, thereby promoting efficient, rapid heat transfer and aiding the PPTC resistor 216 to trip to its protective, high resistance state.

Similarly to the first embodiment discussed herein in connection with FIGS. 2 through 6 above, the single PPTC layer 216 forms the substrate for the chip carrier 201. Metal foils are bonded to outer major faces of the PPTC resistor layer 216. A top metal foil is patterned to have a left side major segment 232 which connects to terminal electrode 202, and a right side minor segment 234 which connects to terminal electrode 204. An etch channel 235 divides and separates the major segment 232 and minor segment 234 of the top foil. A bottom metal foil is patterned to have a right side major segment 236 which connects to terminal electrode 204 and a left side major segment 238 which connects to terminal electrode 202. An etch channel 239 divides and separates the major segment 236 from the minor segment 238. Neither the top foil layer segments nor the bottom foil layer segments connect to terminal electrode 206 which is electrically isolated from the PPTC resistor 216 by dielectric material layer 239.

A layer 226 of dielectric material outwardly covers of the segments 232 and 234 of the top foil layer (except at the die well 245 where the layer 226 is removed). A layer 240 of dielectric material covers the segments 236 and 238 of the bottom foil layer. A metal layer comprising patterned segments 242, 244 and 246 is formed over the top dielectric layer 226, and a metal layer comprising patterned segments 254, 256 and 258 is formed over the bottom dielectric layer 240. A metal layer 248 is formed over the segments 242 and 254 at terminal electrode 202. A metal layer 250 is formed over segments 244 and 256 at terminal electrode 204. And, a metal layer 252 is formed over segments 246 and 258 at terminal electrode 206. The die carrier 201 is completed by forming an outer metal layer 260 at terminal electrode 202, an outer metal layer 262 at terminal electrode 204, and an outer metal layer 264, including top face extension 207, at terminal electrode 206.

Figure 7:
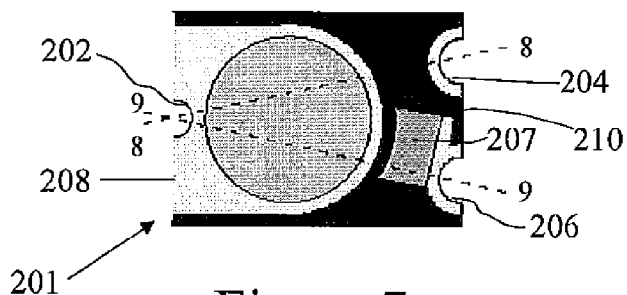
FIG. 7 is an enlarged top plan view of a PPTC chip-carrier of a surface mount circuit protection device comprising a second preferred embodiment of the present invention.
Figure 8:
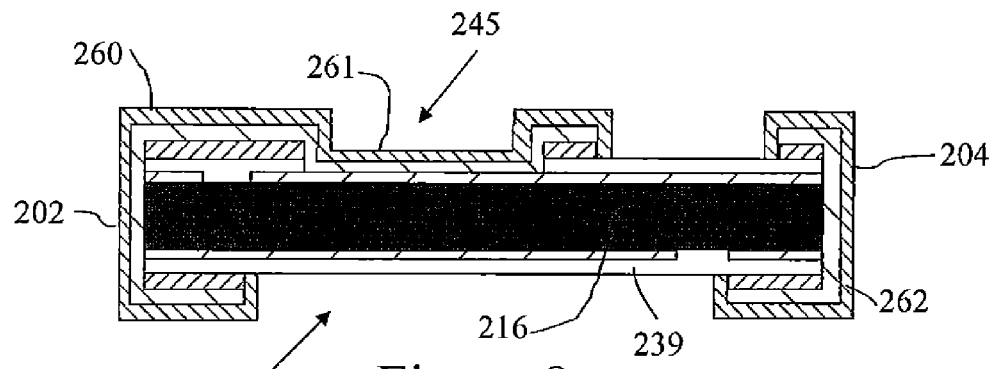
FIG. 8 is an enlarged view of the FIG. 7 chip-carrier in elevation and cross-section along the dashed section line 8-8 in FIG. 7.
Figure 9:
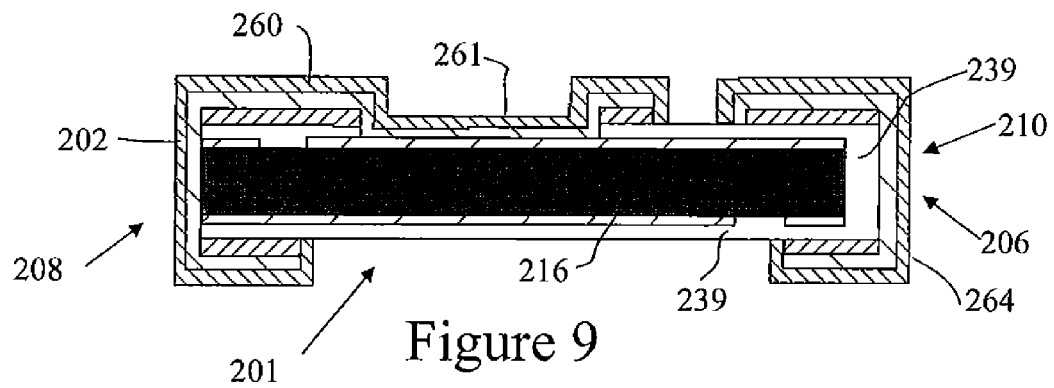
FIG. 9 is an enlarged view of the FIG. 7 chip-carrier in elevation and cross-section along the dashed section line 9-9 in FIG. 7.
Figure 10:
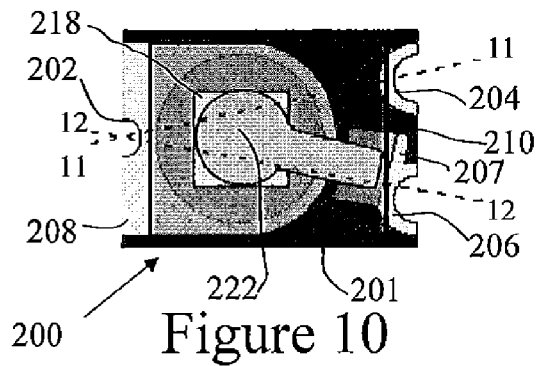
FIG. 10 is an enlarged top plan view of a completed electrical surface mount device including the FIG. 7 chip-carrier in which a semiconductor die is mounted and connected in accordance with principles of the present invention.

After the PPTC die carrier 201 is formed as shown in FIGS. 7-9, the protection device 200 is assembled by placing the heat generating element, e.g. die 218, into the well 245; soldering the die 218 to the facing portion of metal layer 260 with solder material 220, and then soldering the interconnect 222 at one end to terminal extension 207 with a solder 223 and at another end to the outward face of the die 218 with solder 224. An encapsulant material 228 is then formed over the assembled device 200 to provide mechanical rigidity and to seal the die 218 against exposure to ambient conditions and elements.

The electrical circuit protection device can be used with electronic equipment such as cell phones, digital cameras, and digital videodisc players to help protect against damage from an overvoltage condition caused by the connection of an incorrect power supply to an input port of the electronic equipment. The PPTC device trips into a high resistance state, decreasing the current through the diode, and the diode limits voltage seen by the electronic equipment.

Manufacturing Example

A multiplicity of chip carriers 201 in accordance with FIGS. 7 through 12 may be mass produced by the following method. A PPTC laminate having a thickness of about 0.325 mm (0.0128 inch) was prepared by attaching a nickel/copper foil having a thickness of about 0.0356 mm (0.0014 inch) to both sides of a 0.254 mm (0.010 inch)-thick sheet of conductive polymer. The conductive polymer was prepared by mixing about 40% by volume carbon black (Raven™ 430, available from Columbian Chemicals) with about 60% by volume high density polyethylene (Chevron™ 9659, available from Chevron), and then extruding into sheet and laminating under temperature and pressure in a continuous process. The laminated sheet was then cut into individual laminate sheets of approximately 12 inch×16 inch. The laminate sheets were irradiated to 4.5Mrad using a 4.5 MeV electron beam.

The laminate sheets were drilled in an asymmetric pattern around the periphery to provide holes and slots to register the laminates in a known x-y orientation in the plane of the laminate. These registration holes and slots were used to align sheets relative to each other in forming a stack, and for subsequent alignment of the tooling for imaging, solder masking, and plating operations. Holes having a diameter of 0.124 mm (0.049 inch) were drilled to create apertures in the laminate. One layer of resin coated copper (0.018 mm (0.0005 inch) thick copper foil coated with a 0.025 mm (0.001 inch) layer of epoxy, available from PolyClad) was also drilled with registration holes suitable for alignment; another of layer of the same resin coated copper was drilled with the alignment registration holes and in addition, drilled to create apertures having a diameter of 0.170 mm (0.067 inch). The outer surfaces of both foil electrodes on the laminate were chemically stripped of nickel, then foil electrodes were patterned using an etching technique commonly used in the circuit board industry, so as to define the electrode features of the device, the residual electrode structures and pull-back features. The outer surface was then treated with a series of chemical baths to surface treat the copper panel surface for improved adhesion.

A stack was formed by positioning one layer of the resin coated copper on the bottom (resin side up), followed by one layer of an epoxy film with a thickness of 0.08 mm (0.003 inch) (I805-99F, available from Tech Film), the laminate layer, followed by the other layer of the resin coated copper which had been drilled with the extra apertures (resin side down). A fixture was used to align the layers, and the stack was heated while under pressure to permanently attach the layers into a laminated structure and to force the epoxy to completely fill the apertures in the laminate. The thickness of the stack formed was approximately 0.51 mm (0.020 inch).

Holes having a diameter of 0.71 mm (0.028 inch) were drilled through the entire stack to form apertures, and holes having a diameter of 0.71 mm (0.028 inch) were drilled through the entire stack to form apertures which were centered on the epoxy filled aperture; this latter aperture is isolated from the laminate's electrode or conductive polymer by the epoxy. The stack was treated with a plasma etch. The apertures were then coated with colloidal graphite, and the stack was electrolytically plated with copper.

The outer surfaces of both external metal foil layers on the stack were patterned using an etching technique consistent with normal PCB manufacturing methods, so as to define the residual conductive members, along with additional etched features which acted as registration fiducial marks for subsequent isolation processes. The registration holes were used to make sure the pattern which was etched was properly aligned with the internal layers which were etched previously.

A soldermask (Finedel DSR 2200 C-7, available from Tamura Kaken Co., Ltd.) was applied to one external metal foil layer of the stack, tack-cured, and then applied to the second external metal foil layer of the stack, and tack-cured. The soldermask was then imaged and developed. The panel was then heated to fully cure the mask. The panel was electrolytically plated with tin in the solder pad regions for use in assembling the silicon die and interconnect onto this device substrate and for use in attaching the assembled devices onto circuit boards.

The panel was divided to produce the individual carrier substrates 201 by a saw, slicing the length of a panel in one direction and then rotating the panel 90 degrees and dicing the width of the panel in one direction, using the etched fiducial features on the laminate as saw locating marks. The element carriers produced had dimensions of about 4.5 mm×3.30 mm×0.68 mm (0.177 inch×0.130 inch×0.027 inch).

Onto the isolated device substrates, a small amount of solder paste was applied on the surface which had the extra aperture in the resin coated copper, and into said aperture, and another small amount of solder paste was applied on the pad area which is connected to the isolated via. A zener diode die 218, which was previously metallized for solder attachment, was placed on the solder paste in the center of the resin coated copper aperture 245. Another small amount of solder paste was applied on the top of the zener diode die. A small nickel metal strap 222 was placed onto solder paste on the zener diode die and also the solder paste on the isolated via pad 207, such that it bridged the two and could later act as electrical interconnect. This assembly was passed through a reflow oven to solder reflow the paste and complete the structure of each device 200. The completed devices 200 are most preferably further sealed or coated with a dam & fill globtop or injection molded dielectric material 228 to further seal the zener die 218 and interconnect strap 222 from exposure to the environment.

The completed exemplary devices 200 had a resistance of about 0.101 ohm when measuring across the PPTC laminate (top foil layer 232, PPTC layer 216 and bottom foil layer 236). Following installation onto a printed circuit board by solder reflow, the exemplary device 200 had a resistance of about 0.164 ohm when measuring across the PPTC laminate. This device 200 tripped in about 0.090 second at 3.5 A with a zener diode clamping voltage of about 7.2V.

While two embodiments of protective devices in accordance with principles of the present invention have been described, i.e., one embodiment having PPTC resistor structures 102 and 104 in combination with a heat-generating element exemplified by zener diode chip 20 secured by metal contact to resistor structure 104, and another embodiment providing a PPTC chip carrier 201 to which a heat generating element exemplified by zener diode chip 216 is secured by direct metal contact, those skilled in the art will appreciate that more than one or two structures and PPTC resistor layers may be provided to form a structure of plural heat generating components. Also, more than one heat-generating element may be operatively bonded by direct metal contact to a PPTC resistive layer, thereby increasing circuit complexity within the protective device itself while providing superior thermal transfer characteristics.

Having thus described preferred embodiments of the invention, it will now be appreciated that the objects of the invention have been fully achieved, and it will be understood by those skilled in the art that many changes in construction and widely differing embodiments and applications of the invention will suggest themselves without departing from the spirit and scope of the invention. Therefore, the disclosures and descriptions herein are purely illustrative and are not intended to be in any sense limiting.

What is claimed is:

1. A method for making a surface-mountable electrical circuit protection device comprising steps of:
   (a) forming a substantially planar polymeric positive temperature coefficient resistive ("PPTC") layer having predetermined electrical characteristics and physical dimensions including first and second major surfaces, forming a first electrode layer at the first major surface in intimate electrical contact therewith, and forming a second electrode layer at the second major surface in intimate electrical contact therewith;
   (b) forming first, second and third terminal electrodes along at least one major edge wall of the device, the first terminal electrode being in electrical connection with the first electrode layer, the second terminal electrode being in electrical connection with the second electrode layer, and the third terminal electrode being electrically isolated from the first and second terminal electrodes;
   (c) bonding a first metallized face of at least one heat-generating electrical element to a part of the first electrode layer arranged to receive the heat-generating electrical element; and,
   (d) connecting a second metallized face of the at least one heat-generating electrical element to the third terminal electrode with an interconnect structure.

2. The method for making a surface-mountable electrical circuit protection device set forth in claim 1 wherein the at least one heat-generating electrical element comprises a semiconductor die, and comprising a further step of encapsulating the semiconductor die with dielectric material to preclude exposure to the ambient.

3. The method for making a surface-mountable electrical circuit protection device set forth in claim 1 wherein the at least one heat-generating electrical element comprises a semiconductor die that is one of a diode, a zener diode, a bipolar junction transistor, a field effect transistor, a triac, a thyristor, and a silicon controlled rectifier.

4. The method for making a surface-mountable electrical circuit protection device set forth in claim 1 wherein the at least one heat-generating electrical element comprises an electrically passive element.

5. The method for making a surface-mountable electrical circuit protection device set forth in claim 4 wherein the electrically passive element comprises one of a resistor, a varistor, a thermistor, a capacitor and an inductor.

6. A method for making a surface-mountable electrical circuit protection device comprising steps of:
   (a) forming a substantially planar first PPTC element having predetermined electrical characteristics and physical dimensions including first and second major surfaces, forming a first electrode at the first major surface in intimate electrical contact therewith, and forming a second electrode at the second major surface in intimate electrical contact therewith;
   (b) securing a metallized major face of at least one heat-generating electrical component directly to one of the first and second electrodes with a flowable metal binder and
   (c) forming metal interconnection structures including at least three terminal electrodes along at least one major edge of the device, the structures for connecting the first PPTC element and the heat-generating electrical component in a series arrangement, the terminal electrodes for enabling a surface-mounting connection of the first PPTC element and the electrical component to an electrical circuit substrate.

7. The method set forth in claim 6 comprising further steps of forming a second PPTC element having predetermined electrical characteristics and physical dimensions including third and fourth major surfaces, forming a third electrode at the third major surface in intimate electrical contact therewith, and forming a fourth electrode at the fourth major surface in intimate electrical contact therewith; and
   sandwiching the heat-generating electrical component between the first and second PPTC elements of the surface-mountable electrical circuit protection device.

8. The method for making a surface-mountable electrical circuit protection device set forth in claim 6 wherein the at least one heat-generating electrical element comprises a semiconductor die.

9. The method for making a surface-mountable electrical circuit protection device set forth in claim 8 wherein the semiconductor die is one of a diode, a zener diode, a bipolar junction transistor, a field effect transistor, a triac, a thyristor, and a silicon controlled rectifier.

10. The method for making a surface-mountable electrical circuit protection device set forth in claim 6 wherein the at least one heat-generating electrical element comprises an electrically passive element.

11. The method for making a surface-mountable electrical circuit protection device set forth in claim 10 wherein the electrically passive element comprises one of a resistor, a varistor, a thermistor, a capacitor and an inductor.

12. The method set forth in claim 6 wherein the flowable metal binder comprises a solder.

13. A method for making a surface-mountable electrical circuit protection device comprising steps of:
   (a) forming a substantially planar first polymeric positive temperature coefficient resistive ("PPTC") element having predetermined electrical characteristics and physical dimensions including first and second major surfaces, forming a first electrode at the first major surface in intimate electrical contact therewith, and forming a second electrode at the second major surface in intimate electrical contact therewith;
   (b) forming a substantially planar second PPTC element having predetermined electrical characteristics and physical dimensions including third and fourth major surfaces, forming a third electrode at the third major surface in intimate electrical contact therewith, and forming a fourth electrode at the fourth major surface in intimate electrical contact therewith;
   (c) securing at least one heat-generating electrical component between the first and second PPTC elements to be in effective thermal contact with the second and third electrodes such that an electrical current above a threshold level passing through the component causes the component to heat, the heat thereupon being transferred to the first and second PPTC elements and tripping one of the PPTC elements to a high resistance state, and
   (d) forming a plurality of terminal electrodes along at least one major edge of the device in electrical connection with the first and second PPTC elements and the heat-generating electrical component, for enabling a surface-mounting connection of the first and second PPTC elements and the electrical component to an electrical substrate.

14. The method for making a surface-mountable electrical circuit protection device set forth in claim 13 wherein the at least one heat-generating electrical element comprises a semiconductor die.

15. The method for making a surface-mountable electrical circuit protection device set forth in claim 14 wherein the semiconductor die is one of a diode, a zener diode, a bipolar junction transistor, a field effect transistor, a triac, a thyristor, and a silicon controlled rectifier.

16. The method for making a surface-mountable electrical circuit protection device set forth in claim 13 wherein the at least one heat-generating electrical element comprises an electrically passive element.

17. The method for making a surface-mountable electrical circuit protection device set forth in claim 16 wherein the electrically passive element comprises one of a resistor, a varistor, a thermistor, a capacitor and an inductor.

* * * * *